United States Patent
Gao et al.

(10) Patent No.: US 11,201,134 B2
(45) Date of Patent: Dec. 14, 2021

(54) METHOD OF MANUFACTURING SEMICONDUCTOR DEVICE

(71) Applicant: UNITED MICROELECTRONICS CORP., Hsin-Chu (TW)

(72) Inventors: Yonghui Gao, Singapore (SG); Yi Liu, Singapore (SG); Guohai Zhang, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/853,714

(22) Filed: Apr. 20, 2020

(65) Prior Publication Data
US 2021/0327849 A1    Oct. 21, 2021

(51) Int. Cl.
*H01L 23/00* (2006.01)
*H01L 21/02* (2006.01)
*H01L 21/3105* (2006.01)

(52) U.S. Cl.
CPC ............ *H01L 24/83* (2013.01); *H01L 21/022* (2013.01); *H01L 21/0206* (2013.01); *H01L 21/0217* (2013.01); *H01L 21/02126* (2013.01); *H01L 21/31053* (2013.01); *H01L 2224/8302* (2013.01); *H01L 2224/83022* (2013.01)

(58) Field of Classification Search
CPC . H01L 24/83; H01L 21/0206; H01L 21/0217; H01L 21/31053; H01L 21/022; H01L 21/02126; H01L 2224/83022; H01L 2224/8302
See application file for complete search history.

(56) References Cited

U.S. PATENT DOCUMENTS

| | | | |
|---|---|---|---|
| 6,759,710 B2 | 7/2004 | Chan | |
| 7,364,953 B2 | 4/2008 | Dao | |
| 7,977,234 B2 | 7/2011 | Arai | |
| 2002/0160610 A1* | 10/2002 | Arai | H01L 21/76819 438/692 |
| 2003/0022472 A1* | 1/2003 | Goh | H01L 21/76801 438/514 |
| 2009/0181542 A1* | 7/2009 | Lo | H01L 21/76805 438/700 |
| 2019/0287788 A1* | 9/2019 | Lin | H01L 21/2007 |

* cited by examiner

*Primary Examiner* — Quoc D Hoang
(74) *Attorney, Agent, or Firm* — Winston Hsu

(57) ABSTRACT

A method of manufacturing a semiconductor device includes the following steps. A device wafer having a product-obtaining part and an edge part surrounding the product-obtaining part is provided. A passivation layer is formed to cover the device wafer. A first oxide cap layer is formed to cover the passivation layer. An edge trimming process is performed to polish an edge part of the first oxide cap layer, an edge part of the passivation layer and the edge part of the device wafer. A removing process is performed to remove the first oxide cap layer after the edge trimming process is performed. A second oxide cap layer is formed to cover the first oxide cap layer and the edge part of the device wafer.

12 Claims, 3 Drawing Sheets

METHOD OF MANUFACTURING SEMICONDUCTOR DEVICE

BACKGROUND OF THE INVENTION

1. Field of the Invention

The present invention relates generally to a method of manufacturing a semiconductor device, and more specifically to a method of trimming wafer.

2. Description of the Prior Art

In some integrated circuit fabrications, a wafer is trimmed on the edge to reduce damage to the wafer during processing. During the edge trimming, particle debris generates and is left on a surface of the wafer. However, the particle debris cannot be removed easily, and results in wafer bonding bubble or wafer scrap.

SUMMARY OF THE INVENTION

The present invention provides a method of manufacturing a semiconductor device, which forms an oxide layer before performing a trimming process. Hence, defects such as particles left after the trimming process can be removed completely.

The present invention provides a method of manufacturing a semiconductor device including the following steps. A device wafer having a product-obtaining part and an edge part surrounding the product-obtaining part is provided. A passivation layer is formed to cover the device wafer. A first oxide cap layer is formed to cover the passivation layer. An edge trimming process is performed to polish an edge part of the first oxide cap layer, an edge part of the passivation layer and the edge part of the device wafer. A removing process is performed to remove the first oxide cap layer after the edge trimming process is performed. A second oxide cap layer is formed to cover the first oxide cap layer and the edge part of the device wafer.

According to the above, the present invention provides a method of manufacturing a semiconductor device, which forms a passivation layer covering a device wafer, forms a first oxide cap layer covering the passivation layer, and then performs an edge trimming process to polish an edge part of the first oxide cap layer, an edge part of the passivation layer and an edge part of the device wafer. Thereafter, a removing process is performed to remove the first oxide cap layer. Since the first oxide cap layer covers the passivation layer in the present invention, particles remaining on the first oxide cap layer after the edge trimming process is performed can be removed completely by the removing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
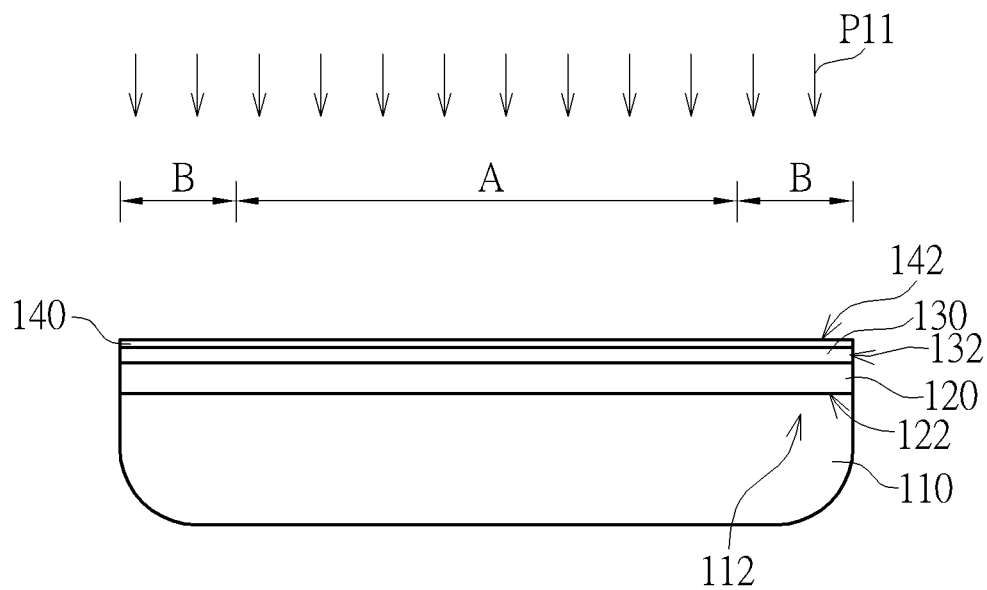
FIG. 1 schematically depicts a cross-sectional view of a method of manufacturing a semiconductor device according to an embodiment of the present invention.

FIGS. 1-6 schematically depict cross-sectional views of a method of manufacturing a semiconductor device according to an embodiment of the present invention. As shown in FIG. 1, a device wafer 110 is provided. The device wafer 110 may be divided into a product-obtaining part A and an edge part B, wherein the edge part B surrounds the product-obtaining part A. The product-obtaining part A may include transistors with various functions, and an inter-dielectric layer may cover these transistors. A device layer 120 may be formed to cover the device wafer 110. The device layer 120 may include inter-metal dielectric layers such as metal 0 to metal 4 layers, depending upon practical requirements. A passivation layer 130 is formed to cover the device layer 120. Preferably, the passivation layer 130 may include a silicon nitride layer, but it is not limited thereto. Still preferably, the passivation layer 130 may include a UV silicon nitride layer, but it is not limited thereto.

It is hard to remove particles remaining on the passivation layer 130 in later processes by scrubbing, brushing and wet cleaning methods such as dilute hyrofluoric acid containing wet cleaning processes. This leads to wafer bonding bubble and scrap. Thus, a first oxide cap layer 140 is formed to cover the passivation layer 130 in the present invention. In a preferred embodiment, the first oxide cap layer 140 may include a tetraethoxysilane (TEOS) oxide film. Thus, particles remaining on the first oxide cap layer 140 in later processes can be removed completely.

Figure 2:
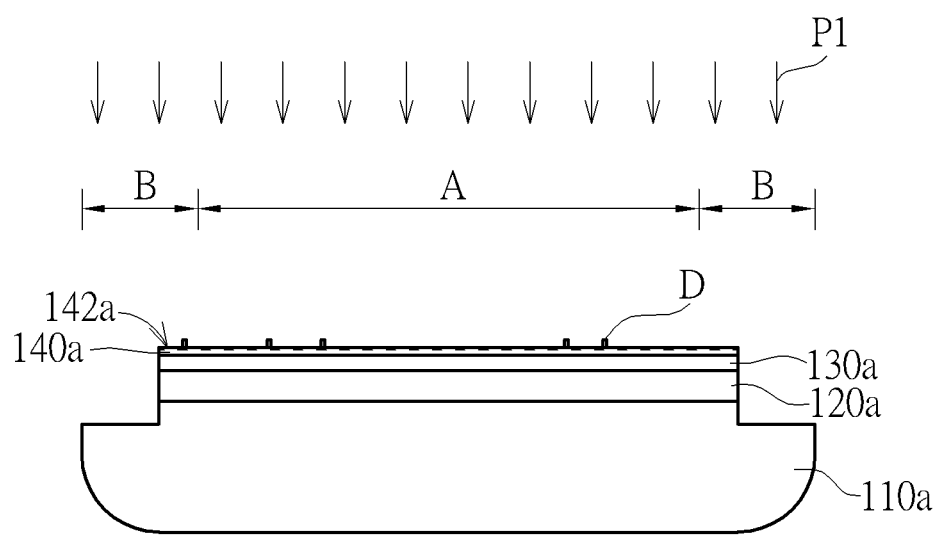
FIG. 2 schematically depicts a cross-sectional view of a method of manufacturing a semiconductor device according to an embodiment of the present invention.

As shown in FIGS. 1-2, an edge trimming process P1 is performed to polish an edge part 142 of the first oxide cap layer 140, an edge part 132 of the passivation layer 130, an edge part 122 of the device layer 120, and the edge part B of the device wafer 110 after the first oxide cap layer 140 is formed, thereby a device wafer 110a, a device layer 120a, a passivation layer 130a and a first oxide cap layer 140a being formed. In a preferred embodiment, the edge trimming process P1 may include a chemical mechanical polishing (CMP) process, but it is not limited thereto. Defects such as particles D remains on the first oxide cap layer 140a after the edge trimming process P1 is performed. Most of these particles D left during performing the edge trimming process P1 are Si/SiO$_2$ particles. A second high jet scrubbing process P11 may be optionally performed on the first oxide cap layer 140 before the edge trimming process P1 is performed to remove defects, depending upon practical requirements.

Figure 3:
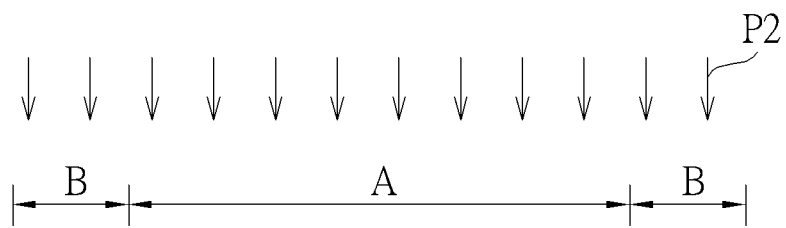
FIG. 3 schematically depicts a cross-sectional view of a method of manufacturing a semiconductor device according to an embodiment of the present invention.
Figure 3:
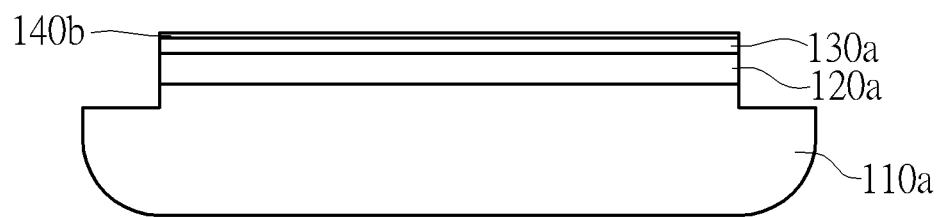

As shown in FIGS. 2-3, a removing process P2 is performed to remove the particles D remaining on the first oxide cap layer 140a and to remove apart 142a of the first oxide cap layer 140a, therefore the particles D are removed completely, and a first oxide cap layer 140b without particles thereon being formed. The removing process P2 may include a first high jet scrubbing process, but it is not limited thereto.

Figure 4:
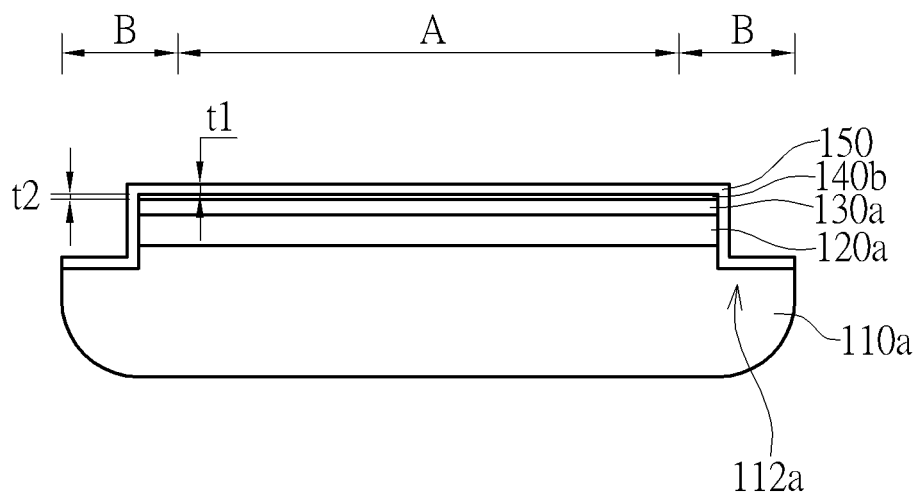
FIG. 4 schematically depicts a cross-sectional view of a method of manufacturing a semiconductor device according to an embodiment of the present invention.

As shown in FIG. 4, a second oxide cap layer 150 is formed to cover the first oxide cap layer 140b and an edge part 112a of the device wafer 110a. In a preferred embodiment, the second oxide cap layer 150 may include a tetraethoxysilane (TEOS) oxide film. In a still preferred embodiment, the first oxide cap layer 140b and the second oxide cap layer 150 are formed by same methods to simplify processes and reduce costs. The first oxide cap layer 140a of FIG. 2 is used to remove the particles D, and thus only a thin film of the first oxide cap layer 140a on the passivation layer 130 is needed. Preferably, a thickness t1 of the second oxide cap layer 150 is larger than a thickness t2 of the first oxide cap layer 140a. For instance, the thickness t2 of the first oxide cap layer 140a is 10-1000 angstroms while the thickness t1 of the second oxide cap layer 150 is 27000 angstroms.

Figure 5:
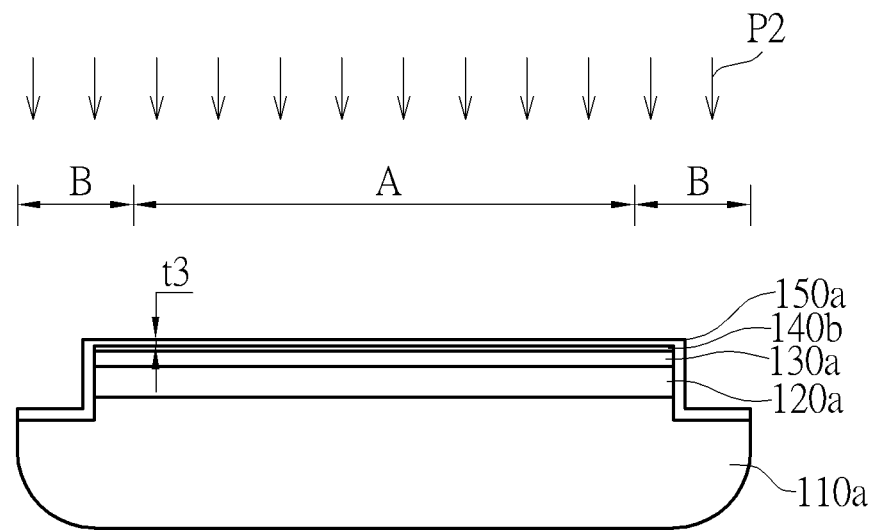
FIG. 5 schematically depicts a cross-sectional view of a method of manufacturing a semiconductor device according to an embodiment of the present invention.

As shown in FIG. 5, a polishing process P2 may be performed before bonding the device wafer 110a to a carrier wafer, therefore a second oxide cap layer 150a with a proper thickness t3 for bonding being obtained. In a preferred embodiment, the polishing process P2 may include a chemical mechanical polishing (CMP) process, but it is not limited thereto.

Figure 6:
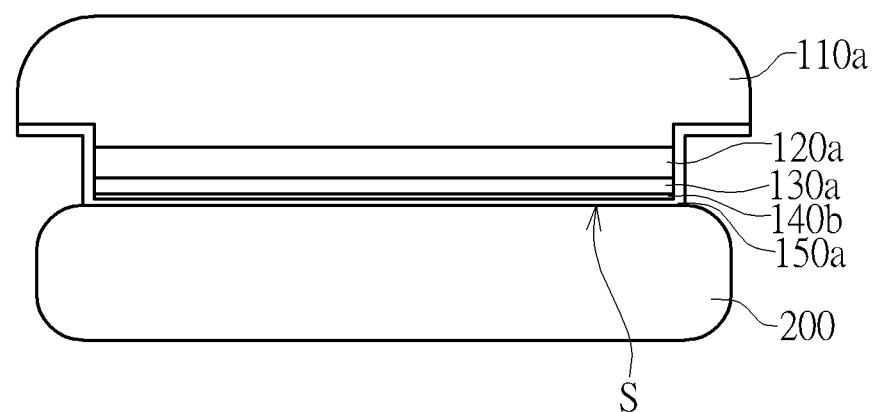
FIG. 6 schematically depicts a cross-sectional view of a method of manufacturing a semiconductor device according to an embodiment of the present invention.

As shown in FIG. 6, the device wafer 110a is bonded with a trap rich wafer (or a carrier wafer) 200 by serving a side S of the second oxide cap layer 150a as a bonding interface.

To summarize, the present invention provides a method of manufacturing a semiconductor device, which forms a passivation layer covering a device wafer, forms a first oxide cap layer covering the passivation layer, and then performs an edge trimming process to polish an edge part of the first oxide cap layer, an edge part of the passivation layer and an edge part of the device wafer. Thereafter, a removing process is performed to remove the first oxide cap layer. Since the first oxide cap layer covers the passivation layer in the present invention, particles remaining on the first oxide cap layer after the edge trimming process is performed can be removed completely by the removing process.

Moreover, the passivation layer may include a silicon nitride layer, and thus the first oxide cap layer preferably includes an oxide layer. Still preferably, the first oxide cap layer and the second oxide cap layer both include tetraethoxysilane (TEOS) oxide films, and a thickness of the second oxide cap layer is larger than a thickness of the first oxide cap layer. A thin film of the first oxide cap layer is formed before the edge trimming process is performed, so that the particles left during the edge trimming process can fall on the first oxide cap layer instead of the passivation layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a device wafer having a product-obtaining part and an edge part surrounding the product-obtaining part;
   forming a passivation layer covering the device wafer;
   forming a first oxide cap layer covering the passivation layer;
   performing an edge trimming process to polish an edge part of the first oxide cap layer, an edge part of the passivation layer and the edge part of the device wafer;
   performing a removing process to remove the first oxide cap layer after the edge trimming process is performed; and
   forming a second oxide cap layer covering the first oxide cap layer and the edge part of the device wafer, wherein a thickness of the second oxide cap layer is larger than a thickness of the first oxide cap layer.

2. The method of manufacturing a semiconductor device according to claim 1, wherein the passivation layer comprises a silicon nitride layer.

3. The method of manufacturing a semiconductor device according to claim 2, wherein the silicon nitride layer comprises a UV silicon nitride layer.

4. The method of manufacturing a semiconductor device according to claim 1, wherein the first oxide cap layer and the second oxide cap layer comprise tetraethoxysilane (TEOS) oxide films.

5. The method of manufacturing a semiconductor device according to claim 1, wherein the thickness of the first oxide cap layer is 10-1000 angstroms while the thickness of the second oxide cap layer is 27000 angstroms.

6. The method of manufacturing a semiconductor device according to claim 1, wherein the edge trimming process comprises a chemical mechanical polishing (CMP) process.

7. The method of manufacturing a semiconductor device according to claim 1, wherein the removing process comprises a first high jet scrubbing process.

8. The method of manufacturing a semiconductor device according to claim 1, further comprising:
   bonding the device wafer with a trap rich wafer by serving a side of the second oxide cap layer as a bonding interface after the second oxide cap layer is formed.

9. The method of manufacturing a semiconductor device according to claim 8, further comprising:
   performing a polishing process before bonding the device wafer with the trap rich wafer.

10. The method of manufacturing a semiconductor device according to claim 1, further comprising:
    performing a second high jet scrubbing process on the first oxide cap layer before the edge trimming process is performed.

11. The method of manufacturing a semiconductor device according to claim 1, further comprising:
    forming a device layer covering the device wafer before the passivation layer is formed.

12. The method of manufacturing a semiconductor device according to claim 11, wherein the device layer comprises inter-metal dielectric layers.

* * * * *